US011623735B2

(12) United States Patent
Tomescu

(10) Patent No.: US 11,623,735 B2
(45) Date of Patent: *Apr. 11, 2023

(54) BLADE ANGLE POSITION FEEDBACK SYSTEM WITH MAGNETIC SHIELD

(71) Applicant: PRATT & WHITNEY CANADA CORP., Longueuil (CA)

(72) Inventor: Dana Tomescu, Brampton (CA)

(73) Assignee: PRATT & WHITNEY CANADA CORP., Longueuil (CA)

( * ) Notice: Subject to any disclaimer, the term of this patent is extended or adjusted under 35 U.S.C. 154(b) by 6 days.

This patent is subject to a terminal disclaimer.

(21) Appl. No.: 17/327,038

(22) Filed: May 21, 2021

(65) Prior Publication Data

US 2021/0284323 A1    Sep. 16, 2021

Related U.S. Application Data

(63) Continuation of application No. 16/516,191, filed on Jul. 18, 2019, now Pat. No. 11,046,423.

(51) Int. Cl.
*B64C 11/06* (2006.01)
*G01B 7/30* (2006.01)
*G01R 33/038* (2006.01)

(52) U.S. Cl.
CPC ............... *B64C 11/06* (2013.01); *G01B 7/30* (2013.01); *G01R 33/038* (2013.01)

(58) Field of Classification Search
None
See application file for complete search history.

(56) References Cited

U.S. PATENT DOCUMENTS

| 4,934,901 | A  | 6/1990  | Duchesneau   |
| 5,897,293 | A  | 4/1999  | Arel et al.  |
| 5,913,659 | A  | 6/1999  | Doolin et al.|
| 6,077,040 | A  | 6/2000  | Pruden et al.|
| 8,687,206 | B2 | 4/2014  | Hockaday     |
| 9,821,901 | B2 | 11/2017 | Duke et al.  |

(Continued)

FOREIGN PATENT DOCUMENTS

| EP | 0353076 | 1/1990 |
| EP | 2591238 | 5/2013 |

(Continued)

*Primary Examiner* — Jas A Sanghera
(74) *Attorney, Agent, or Firm* — Norton Rose Fulbright Canada LLP

(57) ABSTRACT

A blade angle feedback assembly for a variable-pitch rotor of an aircraft engine, the rotor rotatable about an axis and having rotor blades rotatable about respective spanwise axes to adjust a blade angle thereof, is provided. A sensor is configured to provide feedback on the blade angle of the rotor blades by detecting a relative movement between the sensor and a feedback device having at least one position marker thereon. The sensor comprises a magnet having a magnetic field and a first pole and a second pole opposite the first pole. A magnetic shield is configured to define a magnetic return path for at least a portion of a magnetic flux of the magnetic field exiting from the first pole of the magnet toward the second pole, the magnetic shield comprising at least one wall member spanning a distance of relative displacement between the feedback device and the sensor.

20 Claims, 10 Drawing Sheets

(56) References Cited

U.S. PATENT DOCUMENTS

| | | | |
|---|---|---|---|
| 11,046,423 B2* | 6/2021 | Tomescu | G01P 3/488 |
| 2008/0258739 A1* | 10/2008 | Niwa | G01D 5/2013 |
| | | | 324/654 |
| 2014/0007591 A1 | 1/2014 | Khibnik et al. | |
| 2018/0050816 A1* | 2/2018 | Yakobov | B64D 35/02 |
| 2018/0304991 A1 | 10/2018 | Kudrna | |

FOREIGN PATENT DOCUMENTS

| | | |
|---|---|---|
| EP | 2876046 | 5/2015 |
| EP | 3284665 | 2/2018 |
| EP | 3396304 | 10/2018 |
| WO | 2013145644 | 10/2013 |

* cited by examiner

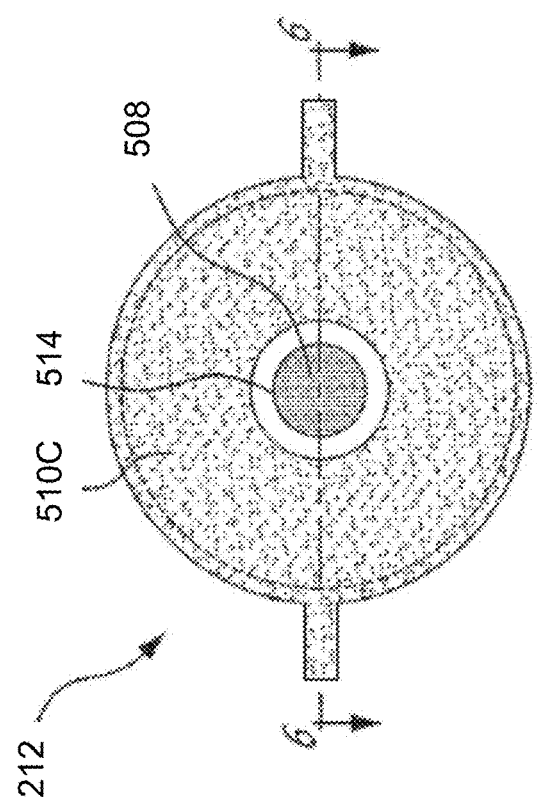
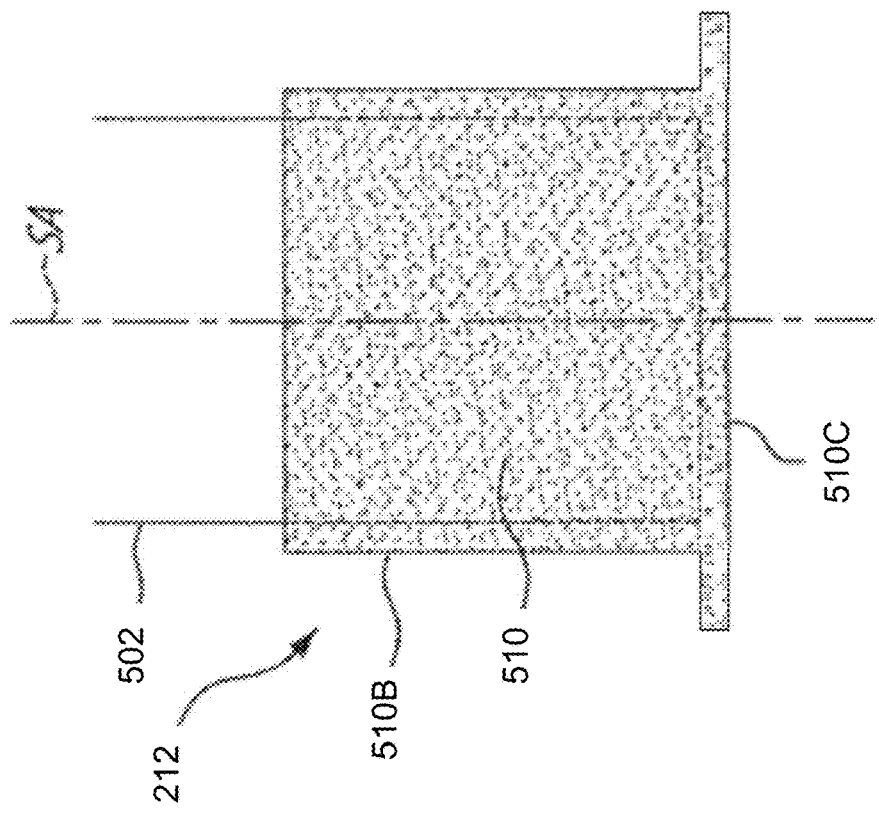
FIG. 5B
FIG. 5A

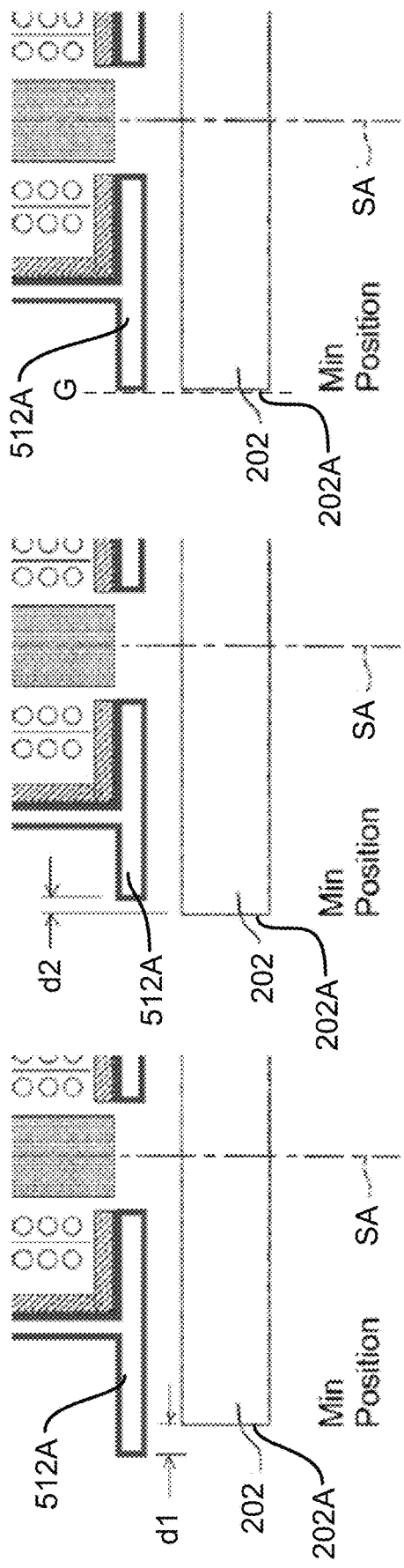

BLADE ANGLE POSITION FEEDBACK SYSTEM WITH MAGNETIC SHIELD

CROSS-REFERENCE TO RELATED APPLICATION

This application is a continuation of U.S. application Ser. No. 16/516,191 filed Jul. 18, 2019, the entire contents of both of which are incorporated by reference herein.

TECHNICAL FIELD

The present disclosure relates generally to variable-pitch propellers for aircraft, and more specifically to blade angle position feedback systems.

BACKGROUND OF THE ART

On featherable aircraft propeller systems, it is desirable to accurately measure the propeller blade pitch (or beta) angle to ensure that the blade angle is controlled according to the engine power set-point requested, such as in reverse and low pitch situations, also known as the beta operating region. For this purpose, some propeller feedback systems use a beta or feedback device, sometimes referred to as a phonic wheel, which rotates with the engine. The feedback device has multiple readable markers and a sensor can be used to measure the rotation of the feedback device via the markers, providing a proxy value for the rotational velocity of the engine, as well as measure blade angle. Existing feedback devices are however vulnerable to a so-called "edge-effect" that leads to an increase in reading error as the sensor approaches the edges of the feedback device.

Therefore, improvements are needed.

SUMMARY

In accordance with a broad aspect, there is provided a blade angle feedback assembly for a variable-pitch rotor of an aircraft engine is provided. The rotor is rotatable about an axis and has rotor blades rotatable about respective spanwise axes to adjust a blade angle thereof. The blade angle feedback assembly comprises at least one sensor configured to provide feedback on the blade angle of the rotor blades by detecting a relative movement between a feedback device and the at least one sensor, the feedback device having at least one position marker thereon, and the at least one sensor comprising a magnet having a first pole and a second pole opposite the first pole, the magnet having a magnetic field. The blade angle feedback assembly also comprises a magnetic shield configured to define a magnetic return path for at least a portion of a magnetic flux of the magnetic field exiting from the first pole of the magnet toward the second pole, the magnetic shield comprising at least one wall member spanning a distance of relative displacement between the feedback device and the at least one sensor In accordance with another broad aspect, there is provided a sensor for detecting at least one feature, the sensor comprising a magnet having a first pole and a second pole opposite the first pole, the magnet having a magnetic field, a pole piece coupled to the first pole of the magnet and configured to direct the magnetic field toward the at least one feature, at least one coil mounted in the magnetic field and being stationary relative to the magnet, the at least one coil configured to generate a sensor signal indicative of a variation in the magnetic field caused by movement of the at least one feature in the magnetic field, and a magnetic shield configured to define a magnetic return path for some of a magnetic flux of the magnetic field exiting from the first pole of the magnet toward the second pole, the magnetic shield comprising at least one wall member spanning a distance of relative displacement between the at least one feature and the sensor.

Features of the systems, devices, and methods described herein may be used in various combinations, in accordance with the embodiments described herein.

BRIEF DESCRIPTION OF THE DRAWINGS

Reference is now made to the accompanying figures in which:

FIGS. 5A and 5B are respective schematic front and bottom views of an exemplary sensor of the feedback system of FIG. 2, with a magnetic shield provided thereon, in accordance with one embodiment;

FIGS. 9A, 9B, and 9C are partial cross-sectional views of three exemplary embodiments of a material extension of the magnetic shield of FIGS. 5A and 5B, showing three possible lengths for the material extension.

It will be noted that throughout the appended drawings, like features are identified by like reference numerals.

DETAILED DESCRIPTION

Figure 1:
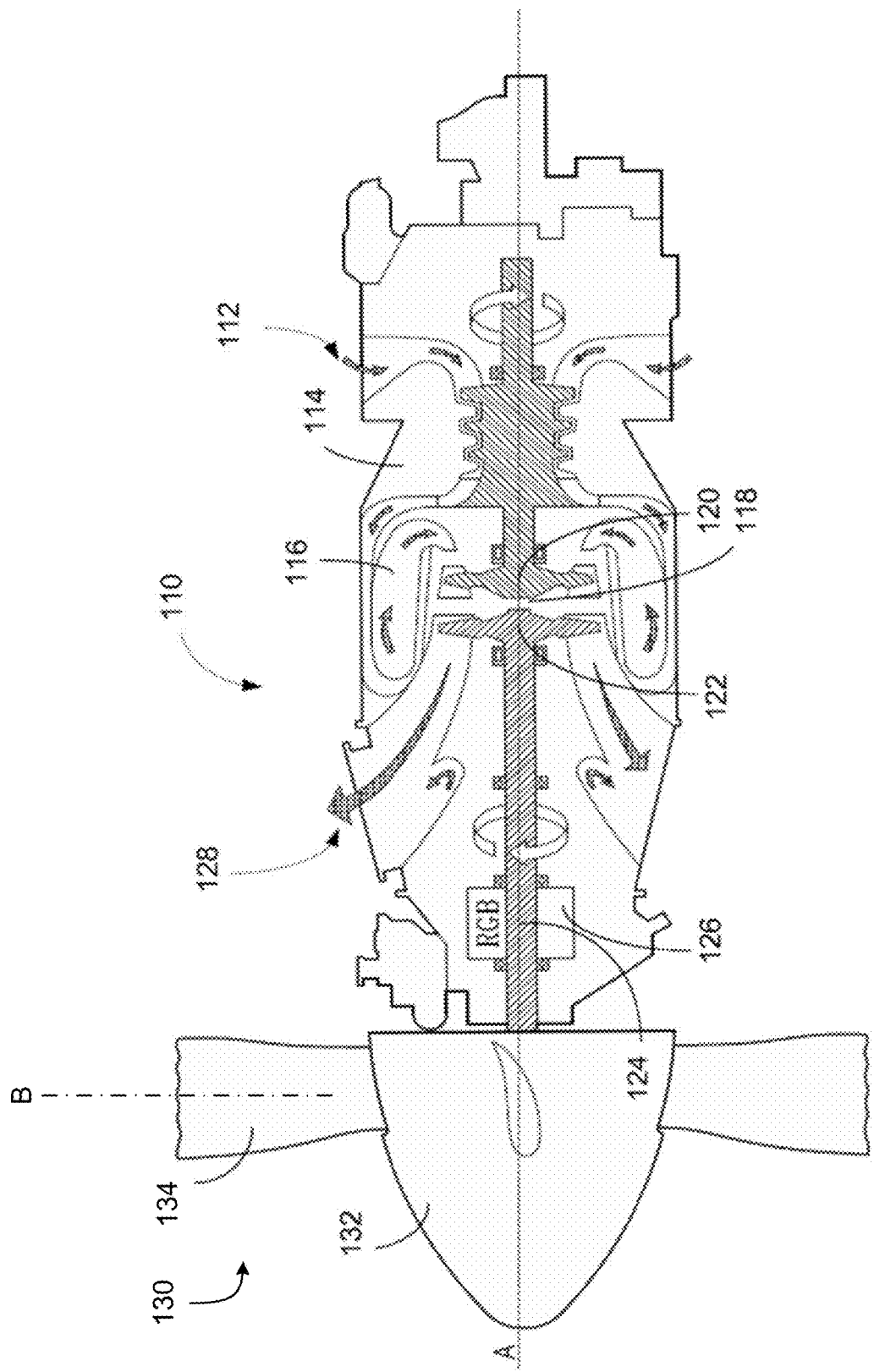
FIG. 1 is a schematic cross-sectional view of an example gas turbine engine.

FIG. 1 depicts a gas turbine engine 110 of a type typically provided for use in subsonic flight. The engine 110 comprises an inlet 112 through which ambient air is propelled, a compressor section 114 for pressurizing the air, a combustor 116 in which the compressed air is mixed with fuel and ignited for generating an annular stream of hot combustion gases, and a turbine section 118 for extracting energy from the combustion gases.

The turbine section 118 comprises a compressor turbine 120, which drives the compressor assembly and accessories, and at least one power or free turbine 122, which is independent from the compressor turbine 120 and rotatingly drives a rotor shaft (also referred to herein as a propeller shaft or an output shaft) 124 about a propeller shaft axis 'A' through a reduction gearbox (RGB) 126. Rotation of the output shaft 124 is facilitated by one or more bearing assemblies (not illustrated), which can be disposed within the RGB 126 or at any other suitable location. Hot gases may then be evacuated through exhaust stubs 128. The gas generator of the engine 110 comprises the compressor section 114, the combustor 116, and the turbine section 118.

A rotor, in the form of a propeller 130 through which ambient air is propelled, is hosted in a propeller hub 132. The rotor may, for example, comprise the propeller 130 of a fixed-wing aircraft, or a main (or tail) rotor of a rotary-wing aircraft such as a helicopter. The propeller 130 may comprise a plurality of circumferentially-arranged blades 134 connected to the hub 132 by any suitable means and extending radially therefrom. The blades 134 are also each rotatable about their own radial axes B through a plurality of blade angles, which can be changed to achieve modes of operation, such as feather, full reverse, and forward thrust.

Figure 2:
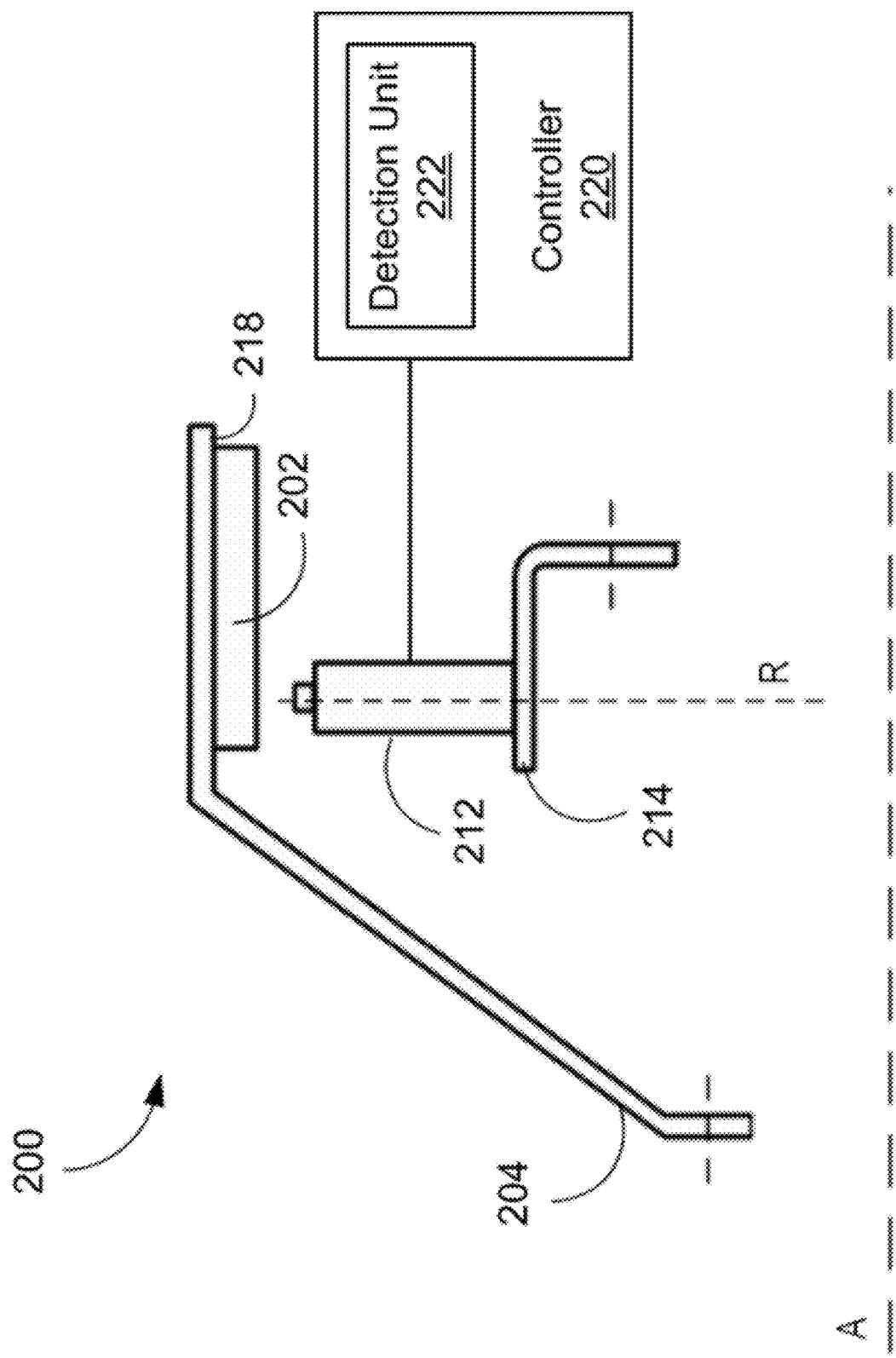
FIG. 2 is a schematic diagram of an example feedback sensing system.

With reference to FIG. 2, a feedback sensing system 200 for pitch-adjustable blades of bladed rotors of aircraft will now be described. The system 200 may be used for sensing a feedback device (also referred to as a feedback ring or phonic wheel) 204 of an aircraft propeller. It should however be understood that, although the system 200 is described and illustrated herein with reference to an aircraft propeller, such as the propeller 130 of FIG. 1, the system 200 may apply to other types of rotors, such as those of helicopters. The systems and methods described herein are therefore not limited to being used for aircraft propellers.

In some embodiments, the system 200 provides for detection and measurement of rotational velocity of one or more rotating elements of the engine 110 and of propeller blade angle on propeller systems, such as the propeller 130 of FIG. 1. The system 200 may interface to existing mechanical interfaces of typical propeller systems to provide a digital detection for electronic determination of the propeller blade angle. It should be noted that although the present disclosure focuses on the use of the system 200 and the feedback device 204 in gas-turbine engines, similar techniques can be applied to other types of engines, including, but not limited to, electric engines and hybrid electric propulsion systems having a propeller driven in a hybrid architecture (series, parallel, or series/parallel) or turboelectric architecture (turboelectric or partial turboelectric).

The system 200 comprises an annular member 204 and one or more sensors 212 positioned proximate the annular member 204. Annular member 204 (referred to herein as a feedback device) has a plurality of detectable features (also referred to as position markers or teeth) 202 disposed thereon for detection by sensor(s) 212. In some embodiments, the feedback device 204 is mounted for rotation with propeller 130 and to move axially with adjustment of the blade angle of the blades (reference 134 in FIG. 1) of the propeller 130, and the one or more sensors 212 are fixedly mounted to a static portion of the engine 110. In other embodiments, the one or more sensors 212 are mounted for rotation with propeller 130 and to move axially with adjustment of the blade angle of the blades 134 of the propeller 130, and the feedback device 204 is fixedly mounted to a static portion of the engine 110.

The system 200 also includes a controller 220 communicatively coupled to the one or more sensors 212. The sensor(s) 212 are configured for producing a sensor signal which is transmitted to or otherwise received by the controller 220, for example via a detection unit 222 thereof. The sensor signal can be an electrical signal, digital or analog, or any other suitable type of signal. In some embodiments, the sensor(s) 212 produce a signal pulse in response to detecting the presence of a position marker 202 in a sensing zone of the sensor 212. For example, the sensor 212 is an inductive sensor that operates on detecting changes in magnetic flux, and has a sensing zone which encompasses a circular or rectangular area or volume in front of the sensor 212. When a position marker 202 is present in the sensing zone, or passes through the zone during rotation of the feedback device 204, the magnetic flux in the sensing zone is varied by the presence of the position marker 202, and the sensor 212 can produce a signal pulse, which forms part of the sensor signal. Accordingly, the position markers 202 may be made of any suitable material (e.g., a ferromagnetic material, Mu-Metal, or the like) which would cause the passage of the position markers 202 near the sensor 212 to provide a change in magnetic permeability within the magnetic field generated by the sensor 212.

In the example illustrated in FIG. 2, a side view of a portion of feedback device 204 and sensor 212 is shown. The sensor (or sensors) 212 is mounted to a flange 214 of a housing of the reduction gearbox 126, so as to be positioned adjacent the plurality of position markers 202. In some embodiments, the sensor 212 is secured to the propeller 130 so as to extend away from the flange 214 and towards the position markers 202 along a radial direction, identified in FIG. 2 as direction 'R'. Sensor 212 and flange 214 may be fixedly mounted, for example to the housing of the reduction gearbox 126, or to any other static element of the engine 110, as appropriate.

In some embodiments, a single sensor 212 is mounted in close proximity to the feedback device 204 and the position markers 202. In some other embodiments, in order to provide redundancy as well as dual-signal sources at multiple locations, one or more additional sensors, which may be similar to the sensor 212, are provided. For example, an additional sensor 212 may be mounted in a diametrically opposite relationship, or at any angle, relative to the position markers 202, which extend away from the feedback device 204 and towards the sensor(s) 212. In yet another embodiment, several position markers 202 may be spaced equiangularly about the perimeter of the feedback device 204. Other embodiments may apply.

Figure 3:
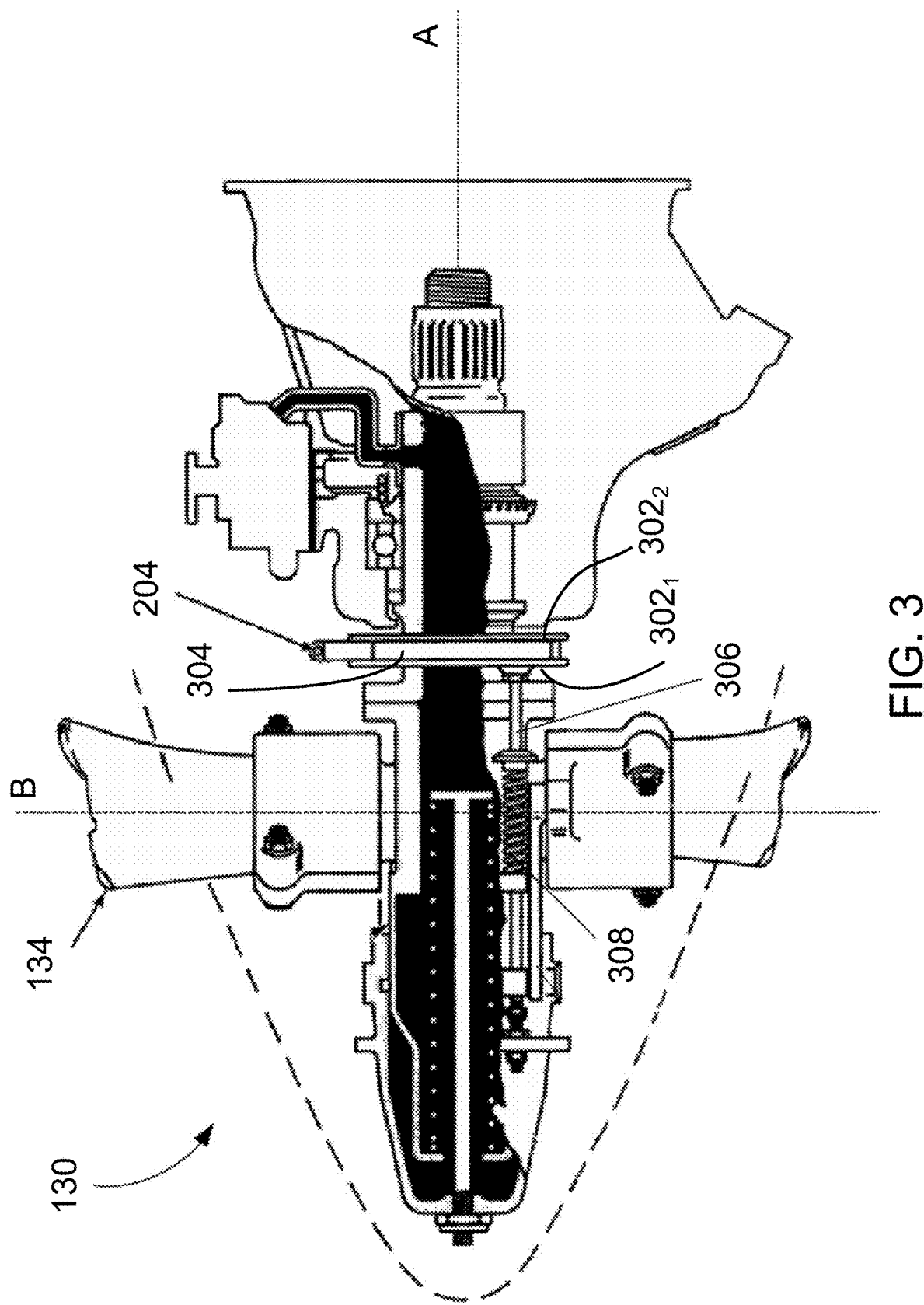
FIG. 3 is a schematic diagram of the propeller of FIG. 1 with the feedback device of FIG. 2, in accordance with an embodiment.

With additional reference to FIG. 3, in some embodiments the feedback device 204 is embodied as a circular disk which rotates as part of the engine 110, for example with the propeller shaft 124 or with the propeller 130. The feedback device 204 comprises opposing faces (not shown) having outer edges $302_1$, $302_2$ and defines a root surface 304 which extends between the opposing faces and circumscribes them. Put differently, the root surface 304 of the feedback device 204 is the outer periphery of the circular disk which spans between the two opposing faces and the root surface 304 intersects the faces at the edges $302_1$, $302_2$. In these embodiments, the position markers 202 can take the form of projections which extend from the root surface 304.

The position markers 202 may comprise a plurality of first projections (not shown) arranged along a direction substantially transverse to the opposing faces and substantially equally spaced from one another on the root surface 304. The position markers 202 may also comprise one or more second projections (not shown) each positioned between two adjacent first projections. Each second projection is illustratively oriented along a direction, which is at an angle relative to the direction along which the first projections are arranged. The angle can be any suitable value between 1° and 89°, for example 30°, 45°, 60°, or any other value, as appropriate. It should be noted, however, that in some other embodiments the second projection(s) can be co-oriented with the first projections. It should also be noted that in some embodiments, each second projection can be substituted for a groove or inward projection, as appropriate. In addition, in some embodiments, the feedback device 204 includes only a single second projection while, in other embodiments, the feedback device 204 can include more than one second projection. In the latter case, the second projections can be oriented along a common orientation or along one or more different orientations and each second projection can be located at substantially a midpoint between two adjacent first projections or can be located close to a particular one of two adjacent first projections.

In one embodiment, the position markers 202 are integrally formed with the feedback device 204 so that the feedback device 204 may have a unitary construction. In another embodiment, the position markers 202 are manufactured separately from the feedback device 204 and attached thereto using any suitable technique, such as welding or the like.

It should also be noted that, although the present disclosure focuses primarily on embodiments in which the position markers 202 are projections, other embodiments are also considered. The position markers 202 may, for example, comprise one or more of protrusions, teeth, walls, voids, recesses, and/or other singularities. For instance, in some embodiments, the position markers 202 may be embedded in the circular disk portion of the feedback device 204, such that the feedback device 204 has a substantially smooth or uniform root surface 304. A position marker 202 can then be a portion of the feedback device 204 which is made of a different material, or to which is applied a layer of a different material. The position markers 202 may then be applied to the root surface 304, for instance as strips of metal or other material for detection by the sensor 212, which can be an inductive sensor capable of sensing changes in magnetic flux (as discussed above) or any other suitable sensor such as a Hall sensor or a variable reluctance sensor. Still other embodiments are considered.

The signal pulses produced by the sensor 212, which form part of the electrical signal received by the control system 220, can be used to determine various operating parameters of the engine 110 and the propeller 130. The regular spacing of the first projections can, for example, be used to determine a speed of rotation of the feedback device 204. In addition, the second projection(s) can be detected by the sensor 212 to determine a blade angle of the propeller 130.

With continued reference to FIG. 3, the feedback device 204 is supported for rotation with the propeller 130, which rotates about the longitudinal axis 'A'. The feedback device 204 is also supported for longitudinal sliding movement along the axis A, e.g. by support members, such as a series of circumferentially spaced feedback rods 306 that extend along the axis A. A compression spring 308 surrounds an end portion of each rod 306.

As depicted in FIG. 3, the propeller 130 comprises a plurality of angularly arranged blades 134, each of which is rotatable about a radially-extending axis B through a plurality of adjustable blade angles, the blade angle being the angle between the chord line (i.e. a line drawn between the leading and trailing edges of the blade) of the propeller blade section and a plane perpendicular to the axis of propeller rotation. In some embodiments, the propeller 130 is a reversing propeller, capable of operating in a variety of modes of operation, including feather, full reverse, and forward thrust. Depending on the mode of operation, the blade angle may be positive or negative: the feather and forward thrust modes are associated with positive blade angles, and the full reverse mode is associated with negative blade angles.

Figure 4:
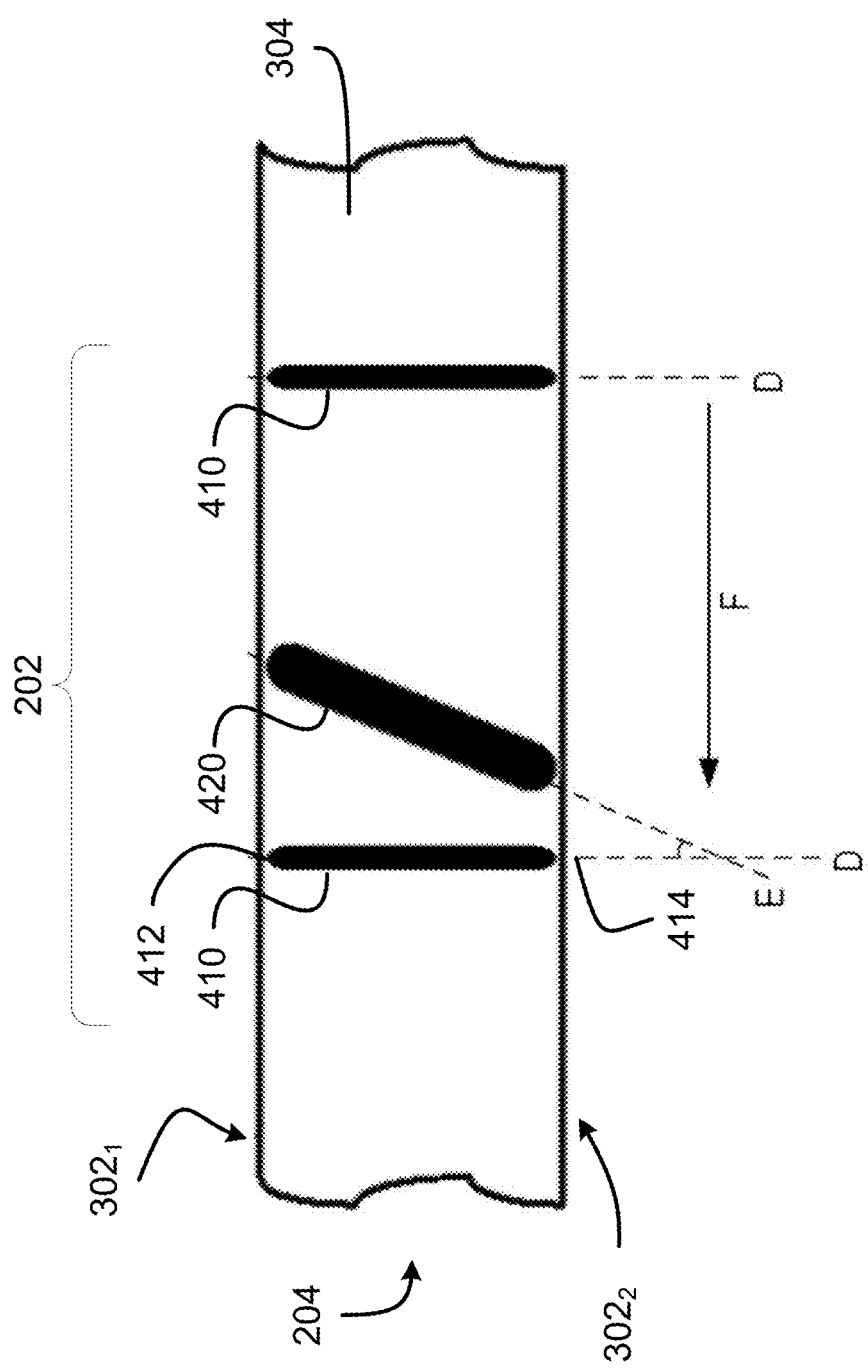
FIG. 4 is a schematic bottom view of the feedback device of FIG. 2 showing position markers, in accordance with one embodiment.

Referring now to FIG. 4 in addition to FIG. 3, the feedback device 204 illustratively comprises position markers 202, which, in one embodiment, can take the form of projections which extend from the root surface 304. As the feedback device 204 rotates, varying portions thereof enter, pass through, and then exit the sensing zone of the sensor 212. From the perspective of the sensor 212, the feedback device 204 moves axially along axis A and rotates about direction F. However, as the sensor 212 is positioned adjacent to the edges $302_1$, $302_2$ of the feedback device 204 as a result of movement of the feedback device 204, a drop in magnetic flux occurs. This results in a so-called "edge-effect" that leads to an increase in reading error (also referred to herein as beta error) at the edges $302_1$, $302_2$, particularly as the feedback device 204 moves away from the sensor 212. In order to permit the sensor 212 to accurately detect the passage of the position markers 202 without any edge-related effects, it is proposed herein to surround the sensor 212 with a magnetic shield (not shown) that extends laterally away from the exterior of the housing 502 and over the position markers 202 so as to cover (i.e. span) a distance of axial displacement (i.e. translation) of the feedback device 204 (and accordingly of the position markers 202) along axis A, as will be discussed further below.

In one embodiment (illustrated in FIG. 4), the position markers 202 include a plurality of projections 410 which are arranged along a direction 'D', which is substantially transverse to the opposing edges $302_1$, $302_2$. Although only two projections 410 are illustrated in FIG. 4, it should be understood that any suitable number of projections 410 may be present across the whole of the root surface 304. The projections 410 can be substantially equally spaced from one another on the root surface 304. In addition, the projections 410 are of substantially a common shape and size, for example having a common volumetric size. In some embodiments, only some of the projections 410 may have extensions whereas others may not and the projections 410 may not always be equally spaced around the root surface 304.

The feedback device 204 also includes at least one supplementary projection 420 which is positioned between two adjacent ones of the projections 410. In the embodiment depicted in FIG. 4, the projection 420 is oriented along a direction 'E', which is at an angle relative to direction D'. The angle between directions D' and 'E' can be any suitable value between 1° and 89°, for example 30°, 45°, 60°, or any other value, as appropriate. It should be noted, however, that in some other embodiments the supplementary projection 420 can be co-oriented with the projections 410, for instance along direction D'.

In some embodiments, the feedback device 204 includes only a single supplementary projection 420. In other embodiments, the feedback device 204 can include two, three, four, or more supplementary projections 420. In embodiments in which the feedback device 204 includes more than one supplementary projection 420, the supplementary projections can all be oriented along a common orientation, for instance direction 'E', or can be oriented along one or more different orientations. The projection 420 can be located at substantially a midpoint between two adjacent projections 410, or, as shown in FIG. 4, can be located close to a particular one of two adjacent projections 410.

Figure 6:
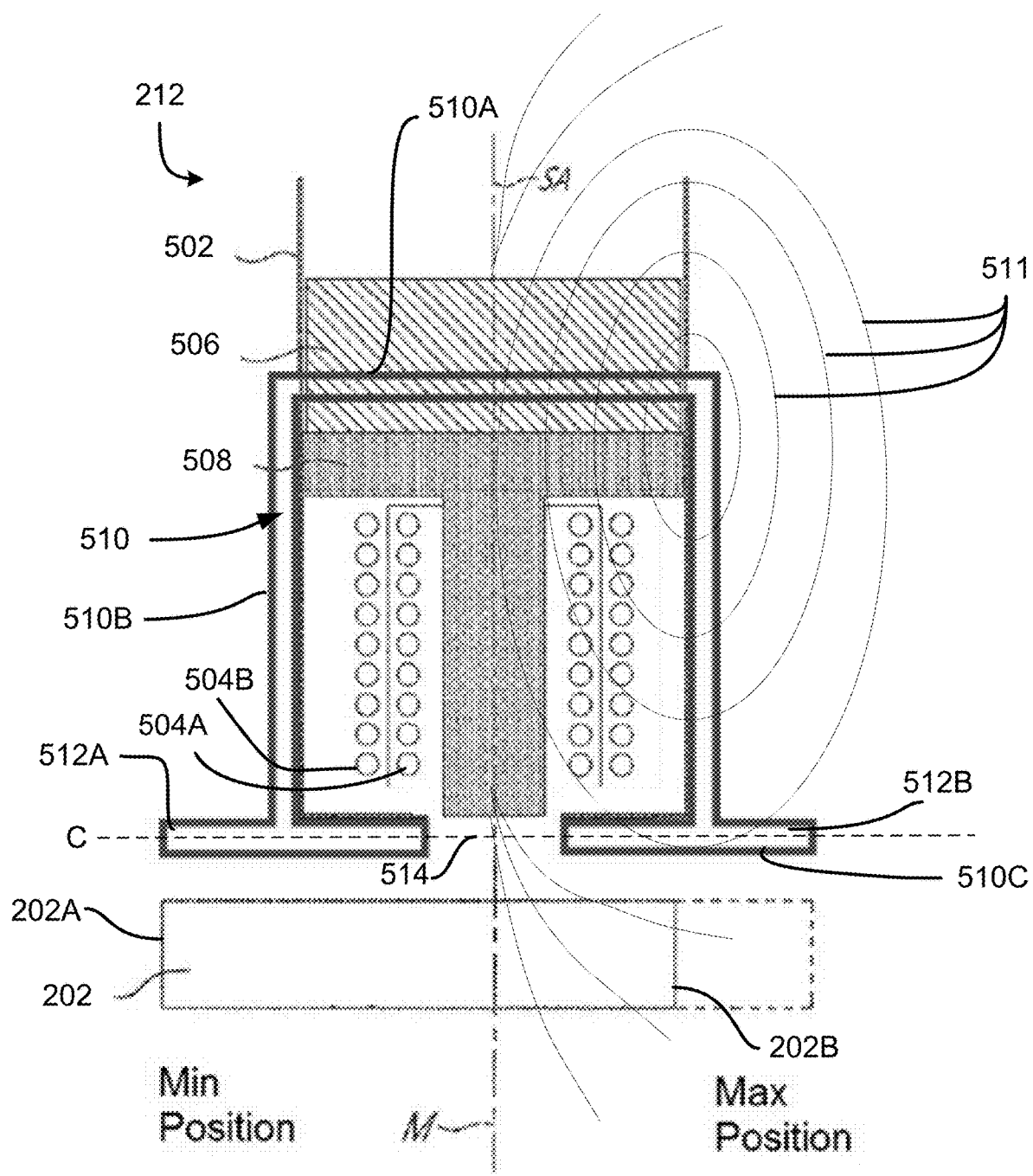
FIG. 6 is a cross-sectional view of the sensor of FIGS. 5A and 5B taken along line 6-6 of FIG. 5B, in accordance with one embodiment.

As shown in FIG. 5A, FIG. 5B, and FIG. 6, the sensor 212 illustratively comprises a housing 502 having a generally cylindrical shape with a sensor axis SA. In some embodiments, the sensor axis SA may be a radial line relative to the axis of rotation (reference A in FIG. 2) of the feedback device (reference 204 in FIG. 2). In some embodiments, the housing 502 may have a circular outer cross-sectional profile (as illustrated in FIG. 5B). The sensor 212 may have a single-channel configuration and accordingly may have a single coil 504A disposed inside of housing 502. The coil 504A may be configured to generate one or more sensor signals in response to variations in the magnetic field caused by the movement of position markers 202 relative to the sensor 212. In other embodiments, the sensor 212 may have a multi-channel configuration wherein sensor signals are acquired in a redundant manner. In this case, the sensor 212 may have a two-channel configuration (as shown in FIG. 6) with two electrically-isolated coils 504A and 504B. In response to the variations in the magnetic field, coil 504A may be configured to generate first sensor signal(s) on a first channel and coil 504B may be configured to generate second sensor signal(s) on a second channel.

Sensor 212 may also comprise a magnet 506 disposed inside housing 502. The magnet 506 illustratively has two opposite (i.e. North and South) poles. The magnet 506 may be a permanent magnet. The magnet 506 may be stationary and mounted adjacent the feedback device 204. In some embodiments, the sensor 212 may comprise pole piece 508, which is configured to direct the magnetic field generated by the magnet 506 radially inwardly (or outwardly) along sensor axis SA and toward the feedback device 204 at a location expected to be occupied by position marker(s) 202. The magnetic flux exiting the distal end of the pole piece 508 may then intersect the position marker(s) 202 as the position marker(s) 202 move past the sensor 212. The magnetic field may therefore include a first magnetic flux intersecting the location that the position marker(s) 202 are expected to occupy and a second magnetic flux (also referred to herein as leakage magnetic flux) not intersecting the location that the position marker(s) 202 are expected to occupy. The leakage magnetic flux may be present substantially around sensor axis SA (e.g., in a substantially axisymmetric manner). Coils 504A and 504B may be wound around pole piece 508, with coil 504A being a radially-inner coil and coil 504B being a radially-outer coil that surrounds coil 504A. Coils 504A, 504B may be stationary relative to magnet 506 and mounted in the magnetic field of magnet 506. The coils 504A, 504B may be of different sizes and/or positions.

A magnetic shield 510 having a generally cylindrical shape may be disposed externally to the sensor housing 502. For example, the magnetic shield 510 may be mounted to the exterior of housing 502 by any suitable means (as illustrated in FIG. 5A, FIG. 5B, and FIG. 6). Alternatively, the magnetic shield 510 may mounted to the interior of housing 502 by any suitable means In one embodiment, the magnetic shield 510 may be configured as a sealed enclosure that surrounds the sensor 212 on all sides. In another embodiment, the magnetic shield 510 may be configured as an unsealed enclosure, which comprises apertures and which does not surround the sensor 212 in its entirety.

The magnetic shield 510 may be made from one or more materials of relatively high magnetic permeability to readily support the formation of a magnetic field within itself. In some embodiments, the magnetic shield 510 is made from Mu-metal or any suitable material(s) exhibiting a relatively high relative magnetic permeability. In some embodiments, the material(s) of the magnetic shield 510 may have a relative magnetic permeability value between 20,000 and 100,000. In other embodiments, the material(s) of the magnetic shield 510 may have a relative magnetic permeability value between 80,000 and 100,000. Other embodiments may apply.

As will be understood by a person skilled in the art and still referring to FIG. 6, a given position marker 202 comprises two opposite axial ends (also referred to as edges or terminations) 202A, 202B, the axial end 202A, 202B being the ends where the position marker 202 terminates in the axial direction relative to rotation axis A. When no magnetic shield 510 is used, as an axial end (e.g., axial end 202A) of the position marker 202 approaches the sensor 212, the different amounts of material from the position marker 202 positioned adjacent either sides of the sensor 212 can result in asymmetric permeability and skew the magnetic field of an unshielded sensor (i.e. offset line M from sensor axis SA). This edge-related effect may in turn cause some error in the sensor signals provided by coils 504A, 504B. For instance, error(s) in the determined axial position of the feedback device 202 and/or discrepancies between signals obtained from separate coils 504A, 504B of different channels may be experienced. In some situations, the error increases exponentially as the axial end 202A moves away from the unshielded sensor 212 and can therefore limit the amount of useable axial movement available for a given length of position markers 202. The magnetic shield 510 may be used to provide one or more low-reluctance return paths for guiding leakage magnetic flux (from the pole piece 508 or the magnet 506). This may in turn reduce the edge-related effect otherwise exhibited using an unshielded sensor, consequently decreasing the likelihood of errors.

In particular, the magnetic shield 510 may provide controlled and predictable magnetic return path(s) for the leakage magnetic flux (511) so that effects of such leakage on coils 504A, 504B may be reduced. It should be understood that, for the sake of clarity, only a few magnetic flux lines for the magnetic flux 511 are illustrated in FIG. 6. The illustrated magnetic flux lines are not to scale but are merely shown for illustrative purposes. Magnetic shield 510 may shunt most of the leakage magnetic flux (which does not intersect with the location that the position markers 202 are expected to occupy) back toward the opposite magnetic pole of magnet 506, thereby isolating such leakage magnetic flux from external influences (e.g., position markers 202). In other words, the magnetic shield 510 efficiently closes the magnetic circuit between the two opposite (i.e. North and South) poles of magnet 506 for leakage magnetic flux. In some embodiments, the magnetic shield 510 may be symmetric across sensor axis SA to define two or more (e.g., symmetric) return paths that are angularly distributed about the sensor axis SA in an axisymmetric manner. It should however be understood that the magnetic shield 510 need not be symmetric across sensor axis SA and the magnetic shield 510 may have any other suitable configuration.

It should also be understood that the magnetic shield 510 may have different configurations in order to achieve different types and amounts of magnetic flux guiding in different applications. For example, the geometry of the magnetic shield 510 may vary based on the specific configurations of the sensor 212 and of the feedback device 204. In the embodiment shown in FIG. 6, the magnetic shield 510 comprises a top wall 510A, at least one side wall 510B, and a bottom wall 510C, cooperatively defining a receptacle within which part of the sensor housing 502 and/or other internal components of the sensor 212 may be received. In particular, magnetic shield 510 may have a receptacle configuration within which coils 504A and 504B are partially or entirely received. In this manner, coils 504A and 504B may be shielded by magnetic shield 510. Part of or the entirety of pole piece 508 may be received inside the receptacle defined by the magnetic shield 510. The magnetic shield 510 may have a single-piece unitary construction wherein top wall 510A, side wall(s) 510B, and bottom wall 510C are integrally formed. It should however be understood that top wall 510A, side wall(s) 510B, and bottom wall 510C may comprise separate components (e.g., washer and sleeve) that are subsequently assembled together to permit magnetic coupling therebetween.

Bottom wall 510C is illustratively disposed between coils 504A, 504B and feedback device 204. In some embodiments, the bottom wall 510C may comprise two spaced wall members 512A, 512B defining an aperture 514 extending through bottom wall 510C. The aperture 514 may permit some of the magnetic flux that is guided by pole piece 508 to pass through the magnetic shield 510 via the aperture 514. In some embodiments, the aperture 514 is centrally located within bottom wall 510C. In some embodiments, sensor axis SA passes through the aperture 514. In some embodiments, a distal portion of pole piece 508 extends into or through the aperture 514. The aperture 514 may be sized and positioned to provide an air gap between the magnetic shield 510 and the pole piece 508.

As shown in FIG. 6, the bottom wall 510C of the magnetic shield 510 illustratively extends laterally away from an exterior of the sensor housing 502, over the position markers 202. This extension of the magnetic shield 510 (also referred to herein as a magnetic shield extension) may be made of the same material as the magnetic shield 510, i.e. of Mu-metal or any other suitable material(s) exhibiting a relatively high relative magnetic permeability. In one embodiment, the magnetic shield extension is integral with the magnetic shield 510, whereby the extension is machined from solid, leaving overhung material extensions. In another embodiment, the magnetic shield extension is added to the magnetic shield 510 by a suitable assembly method (e.g., welding). Other embodiments may apply that include manufacturing methods such as additive manufacturing, casting, forging, extrusion, powder metallurgy, blanking, broaching, milling, grinding, brazing, and other suitable methods.

The magnetic shield extension illustratively spans the distance of axial displacement of the feedback device 204. In particular, the magnetic shield 510 is configured to extend laterally away from the sensor housing 502 so as to fully cover the position markers 202 (i.e. span the distance over which the position marker(s) are displaced) as they travel along the axis A, from a minimum axial translation position to a maximum axial translation position, respectively labelled "Min Position" and "Max Position" in FIG. 6. As a result, the magnetic shield extension allows for inductive coupling to be increased as the position markers 202 pass nearby the sensor 212. The magnetic shield extension therefore provides a permeable material extension which reroutes the path of the magnetic flux lines 511 and increases the magnetic flux density at the edges (references $302_1$, $302_2$ in FIG. 3) of the feedback device 204, as the feedback device 204 moves axially along axis A. The presence of the added material will make detection possible even when the axial position of the feedback device 204 is farthest away from the sensor 212 (i.e., at the minimum and maximum axial translation positions). In this manner, the magnetic flux path is continuous when the feedback device 204 moves axially away from the sensor 212. In other words, the magnetic shield extension results in an extension of the magnetic flux path and the magnetic path extension provides a low reluctance magnetic return path (for some magnetic flux of the magnetic field exiting the pole piece 508 from one pole of the magnet 506 toward the opposite pole) to close the magnetic circuit and reduces the loss of magnetic flux density at the edges $302_1$ and $302_2$. This increases the sensor signal and may in turn mitigate (i.e. reduce) edge-related effects, thereby allowing accurate detection of the position markers 202. The beta error experienced by the feedback system is thus decreased, particularly as the feedback device 204 moves away from the sensor 212.

It should be understood that the geometry of the magnetic shield extension and/or the distance by which the magnetic shield extension projects away from the sensor housing 502 may be optimized for a given application, the parameters (e.g. engine configuration) specific to that application, the distance of the sensor 212 relative to the feedback device 204, the geometry of the feedback device 204, and the beta error experienced by the feedback system. In particular, the thickness, size, and shape of the magnetic shield extension is determined to ensure optimal detection of the position markers 202, depending on the application and/or specific configurations of the sensor 212 and of the feedback device 204. In one embodiment, the magnetic shield extension is configured to extend only as far away from the sensor housing 502 as required to eliminate the beta error.

Figure 7B:
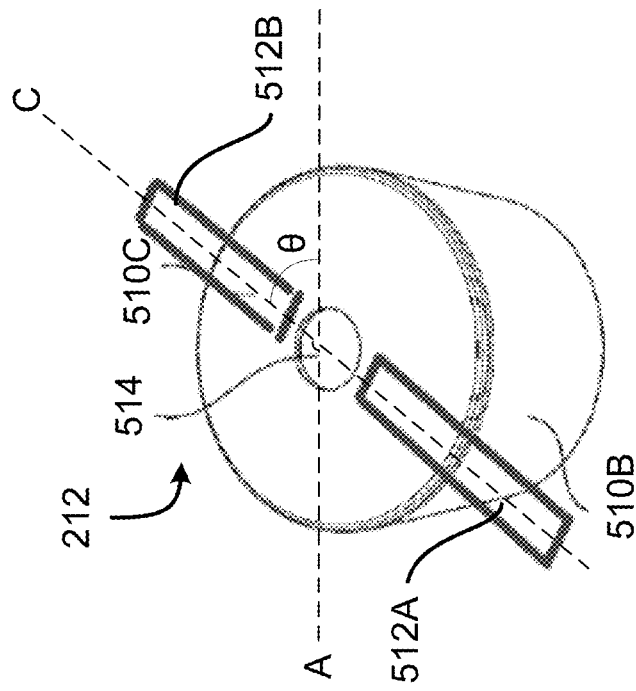
FIGS. 7A and 7B are perspective bottom views of exemplary embodiments of a material extension of the magnetic shield of FIGS. 5A and 5B, showing possible directions for the material extension.
Figure 7A:
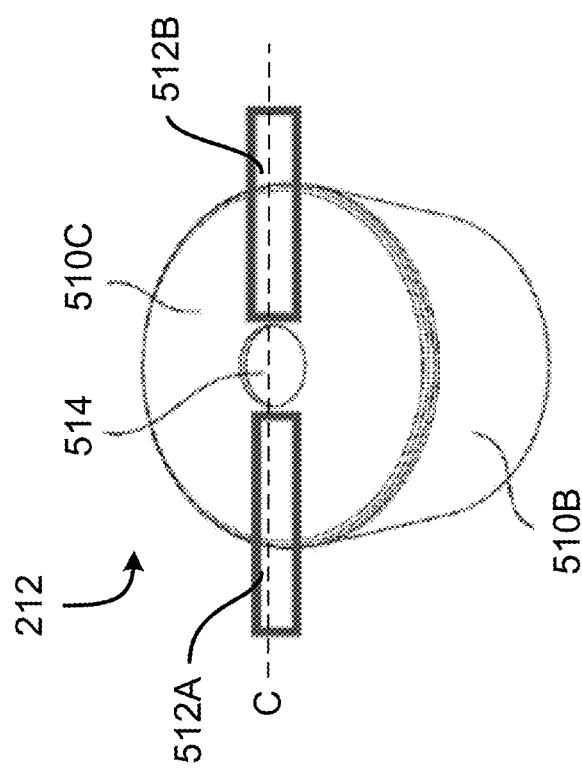

In one embodiment illustrated in FIG. 6, the magnetic shield extension is created by extending the bottom wall members 512A, 512B outwardly and away from the housing 502, along a direction C. In other words, each bottom wall member 512A, 512B projects laterally away from the side wall 510B by a predetermined distance. It should however be understood that the magnetic shield 510 may be extended by providing a plurality of magnetic shield extension members. The magnetic shield extension members may not all extend along a same direction C but may extend in multiple directions. FIG. 6 and FIG. 7A illustrate one embodiment where the direction C is substantially parallel to the direction of axial translation (i.e. axis A of FIG. 1). Still, the magnetic shield extension may extend along other directions. FIG. 7B illustrates an embodiment where the direction C along which the magnetic shield extension (illustrated by bottom wall members 512A, 512B) extends is at an angle θ to the axis A. The angle θ may be selected such that axis C is substantially parallel to the direction (reference D in FIG. 4) along which the angled projection(s) (reference 420 in FIG. 4) extend. Other embodiments may apply. For example, the direction C may be substantially aligned with the direction of radial movement (labelled as direction R shown in FIG. 2), and be accordingly substantially transverse to the axis A.

Figure 8:
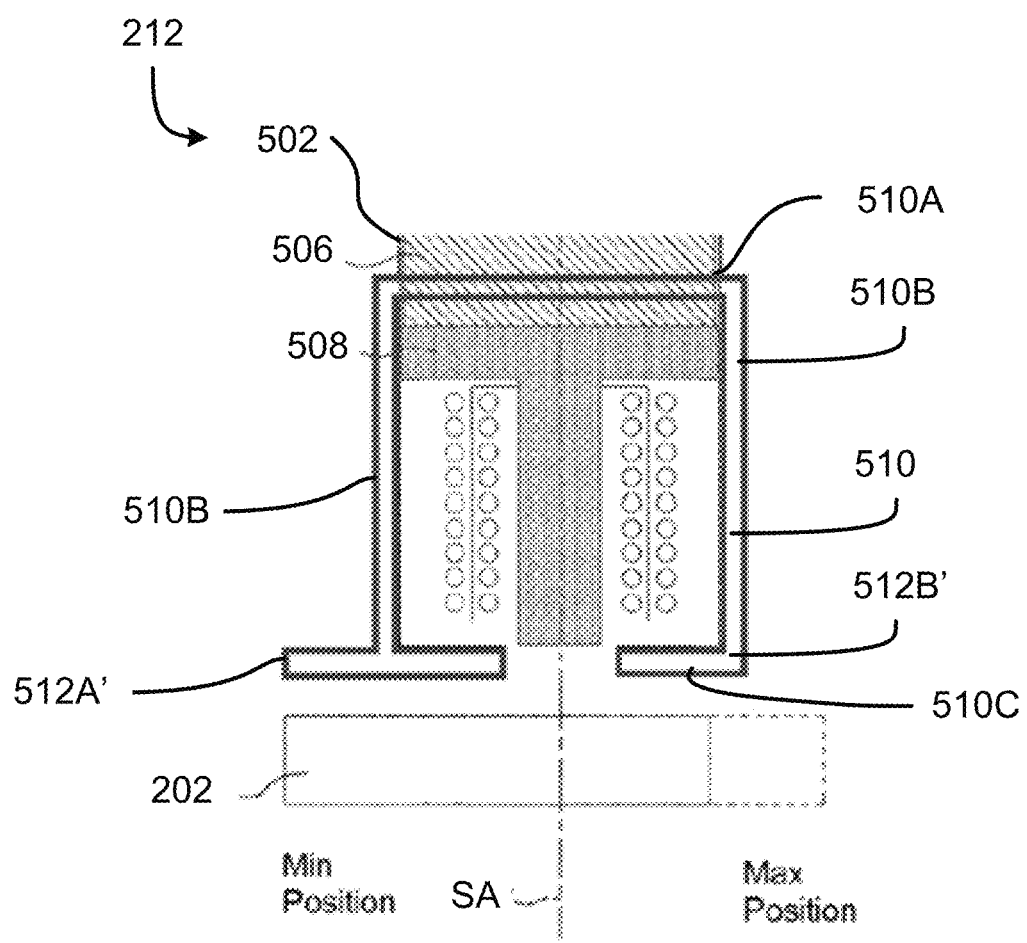
FIG. 8 is a cross-sectional view of the sensor of FIG. 2 with a magnetic shield mounted thereon, in accordance with another embodiment.

FIGS. 5A to 7B show an embodiment where the magnetic shield extension is bilateral, i.e. created on either side of the sensor axis SA (by extending both bottom wall members 512A, 512B), such that the magnetic shield 510 is extended in both the minimum axial translation position and the maximum axial translation position. However, it should be understood that the magnetic shield extension may alternatively be unilateral (i.e. created on one side of the sensor axis SA), such that the magnetic shield 510 is extended in either the minimum axial translation position or the maximum axial translation position. This is shown in FIG. 8, where only bottom wall member 512A' is extended beyond the sensor housing 502. Bottom wall member 512B' does not project outwardly away from the housing 502 and is substantially flush therewith. In the embodiment of FIG. 8, the magnetic shield 510 is therefore only extended in the minimum axial translation position.

The determination as to the side(s) of the sensor axis SA on which the magnetic shield extension is created illustratively depends on the location (i.e. the distance) of the sensor 212 relative to the feedback device 204. Indeed, it is desirable to provide the magnetic shield extension adjacent the edge(s) $302_1$, $302_2$ of the feedback device 204 furthest away from a location where the sensor 212 is positioned. For example, for a feedback device assembly having a sensor 212 located adjacent a given one of the edges (e.g., edge $302_1$), it may be desirable to extend the magnetic shield 510 beyond the opposite edge (e.g., edge $302_2$). If the sensor 212 is positioned between the edges $302_1$, $302_2$, e.g., substantially halfway, it may in turn be desirable to extend the magnetic shield 510 beyond both edges $302_1$, $302_2$. Additional factors, such as the amount of beta error, may also come into play when determining the geometry of the magnetic shield extension. For example, if a higher beta error is exhibited on one side of the feedback device 204, material extension may be added to the magnetic shield 510 in order to balance the readings or eliminate the beta error all together. Available space according to clearances and tolerance stackup of the feedback system may also impact the determination as to which side(s) (i.e. bottom wall member 512A, 512B) of the magnetic shield 510 to extend. Additionally, the determination of which side(s) to extend may be related to the accuracy required by the feedback system and the magnetic shield extension may be employed as a means of achieving the required accuracy.

The length (or span) of the magnetic shield extension (e.g., along direction C) may also be varied according to the application. The magnetic shield extension(s) may indeed be configured to exceed, precede, or match the minimum or maximum axial positions of the position markers 202. In the embodiment shown in FIG. 9A, bottom wall member 512A is configured to exceed the minimum position by a distance d1. In other words, in this embodiment, the bottom wall member 512A extends beyond axial end 202A of the position marker 202 by distance d1. In the embodiment shown in FIG. 9B, the bottom wall member 512A is configured to precede the minimum position by a distance d2. In other words, in this embodiment, the axial end 202A of the position marker 202 extends beyond the edge of the bottom wall member 512A by distance d2. In the embodiment shown in FIG. 9C, bottom wall member 512A is configured to match the axial end 202A of the position marker 202. In other words, in this embodiment, the edge of the bottom wall member 512A and the axial end 202A of the position marker 202 are substantially flush (i.e. terminate in the same plane and are aligned along axis G).

Figure 10B:
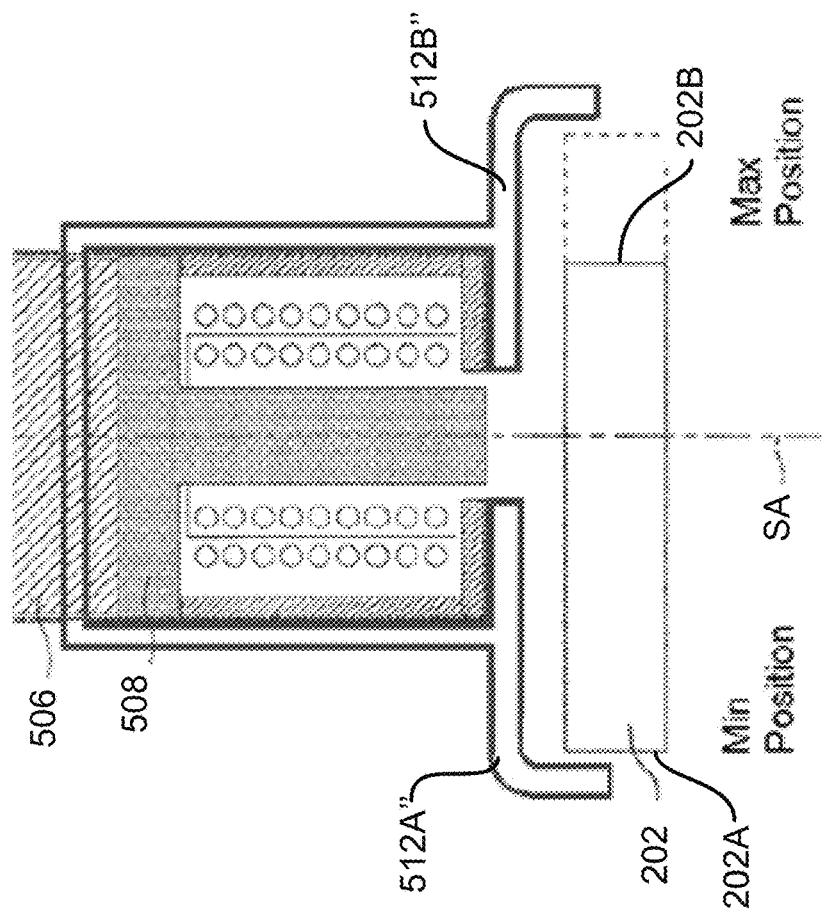
FIGS. 10A and 10B are cross-sectional views of two exemplary embodiments of a material extension of the magnetic shield of FIGS. 5A and 5B, showing two possible shapes for the material extension.
Figure 10A:
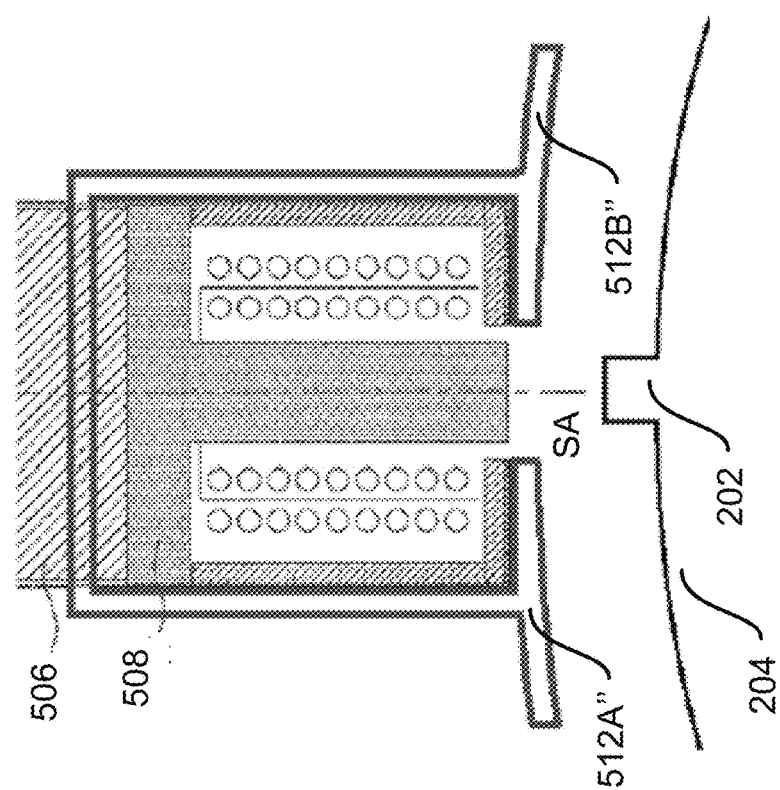

Referring now to FIG. 10A and FIG. 10B, the magnetic shield extension may be configured to have a geometry that matches that of the position markers 202. Indeed, although the magnetic shield extension has thus far been illustrated and described as being a linear extension that extends axially (along direction C in FIG. 6) and outwardly away from the sensor housing 202, the magnetic shield extension may be a radial curvilinear extension (as shown in the embodiment of FIG. 10A) where both bottom wall members 512A" and 512B" are shaped so as to follow the curvilinear shape of the feedback device 204 (see from the front in FIG. 10A) in order to maintain a substantially constant air gap between the feedback device 204 and the magnetic shield 510.

It should however be understood that, depending on the configuration of the feedback device 204, only one of the bottom wall members (e.g. bottom wall member 512A") may be curvilinear while the other bottom wall member (e.g. bottom wall member 512B") remains axial and linear (as shown in FIG. 6 for instance). In this manner, the magnetic shield extension of the magnetic shield 510 may be configured to extend both axially and radially. Other embodiments may apply.

As shown in FIG. 10B, in order to increase the magnetic flux path at the edges $302_1$, $302_2$ of the feedback device 204, the magnetic shield extension may also extend downwards on the peripheral sides of the feedback device 204. In one embodiment, bottom wall members 512A'" and 512B'" may be substantially L-shaped so as to extend downwards towards the axial ends 202A, 202B of the position markers 202. However, it should for example be understood that the shape of the magnetic shield extension need no match the geometry of the position markers 202 (as shown in FIG. 10B for instance). Indeed, the shape of the magnetic shield extension is illustratively designed to increase magnetic flux density and optimize magnetic couple. As such, even if the position markers 202 are rectangular-shaped, the magnetic shield extension may not be rectangular in shape.

From the above description, it can be seen that, in one embodiment, the feedback device 204 may be configured to allow for the sensor 212 to be positioned near or at the edges $302_1$, $302_2$ of the feedback device 204 while accurately detecting the passage of the position markers 202, thereby mitigating any edge-related effects that may influence the sensor 212.

The above description is meant to be exemplary only, and one skilled in the art will recognize that changes may be made to the embodiments described without departing from the scope of the invention disclosed. Still other modifications which fall within the scope of the present invention will be apparent to those skilled in the art, in light of a review of this disclosure.

Various aspects of the systems and methods described herein may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments. Although particular embodiments have been shown and described, it will be apparent to those skilled in the art that changes and modifications may be made without departing from this invention in its broader aspects. The scope of the following claims should not be limited by the embodiments set forth in the examples, but should be given the broadest reasonable interpretation consistent with the description as a whole.

The invention claimed is:

1. A blade angle feedback assembly for a variable-pitch rotor of an aircraft engine, the rotor rotatable about an axis and having rotor blades rotatable about respective spanwise axes to adjust a blade angle thereof, the blade angle feedback assembly comprising:

at least one sensor configured to provide feedback on the blade angle of the rotor blades by detecting a relative movement between a feedback device and the at least one sensor, the feedback device having at least one position marker thereon, and the at least one sensor comprising a magnet having a first pole and a second pole opposite the first pole, the magnet having a magnetic field; and a magnetic shield configured to define a magnetic return path for at least a portion of a magnetic flux of the magnetic field exiting from the first pole of the magnet toward the second pole, the magnetic shield comprising at least one wall member spanning a distance of relative displacement between the feedback device and the at least one sensor.

2. The blade angle feedback assembly of claim 1, wherein the feedback device is coupled to rotate with the rotor about the axis and to be displaced axially along the axis with adjustment of the blade angle, the feedback device having at least one position marker provided thereon, and further wherein the at least one sensor is mounted adjacent the feedback device and configured to detect a passage of the at least one position marker as the feedback device rotates about the axis.

3. The blade angle feedback assembly of claim 2, wherein the magnetic shield is mounted to the at least one sensor and the at least one wall member is positioned adjacent the at least one position marker and configured to span a distance over which the at least one position marker is displaced with axial displacement of the feedback device along the axis.

4. The feedback assembly of claim 3, wherein the at least one sensor comprises a housing having a generally cylindrical shape, the housing containing:
the magnet;
a pole piece coupled to the first pole of the magnet and configured to direct the magnetic field toward the at least one position marker; and
at least one coil mounted in the magnetic field and being stationary relative to the magnet, the at least one coil configured to generate a sensor signal indicative of a variation in the magnetic field caused by movement of the at least one position marker in the magnetic field as the feedback device rotates about the axis relative to the magnet,
further wherein the magnetic shield is mounted to the housing in the magnetic field stationary relative to the magnet, the magnetic return path defined by the magnetic shield being a low reluctance magnetic return path for leakage magnetic flux not intersecting a location that the at least one position marker is expected to occupy on the feedback device.

5. The feedback assembly of claim 4, wherein the at least one wall member of the magnetic shield comprises a top wall, at least one side wall, and a bottom wall cooperatively defining a receptacle within which part of the at least one coil and part of the pole piece are received, the bottom wall positioned adjacent the at least one position marker and comprising an aperture for permitting passage of the magnetic field therethrough, the bottom wall further comprising at least one extension member that extends laterally away from the housing and spans the distance over which the at least one position marker is displaced.

6. The feedback assembly of claim 5, wherein the at least one position marker extends axially from a first end to a second end, and further wherein the at least one extension member extends away from the housing and beyond at least one of the first end and the second end, with an edge of the at least one extension member being spaced from the at least one of the first end and the second end by a predetermined distance.

7. The feedback assembly of claim 5, wherein the at least one position marker extends axially from a first end to a second end, and further wherein the at least one extension member extends away from the housing, with an edge of the at least one extension member preceding the at least one of the first end and the second end by a predetermined distance.

8. The feedback assembly of claim 5, wherein the at least one position marker extends axially from a first end to a second end, and further wherein the at least one extension member extends away from the housing, with an edge of the at least one extension member being aligned with the at least one of the first end and the second end.

9. The feedback assembly of claim 5, wherein the at least one extension member has a curvilinear shape.

10. The feedback assembly of claim 5, wherein the at least one extension member extends along one of a direction substantially parallel to the axis and a direction substantially transverse to the axis.

11. The feedback assembly of claim 5, wherein the at least one position marker comprises a first plurality of position markers circumferentially spaced from one another and at least one second position marker positioned between two adjacent ones of the first plurality of position markers, the first plurality of position markers oriented substantially parallel to the axis and the at least one second position marker oriented along a first direction at an angle relative to the axis, and further wherein the at least one extension member extends along a second direction substantially parallel to the first direction.

12. A sensor for detecting at least one feature, the sensor comprising:
a magnet having a first pole and a second pole opposite the first pole, the magnet having a magnetic field;
a pole piece coupled to the first pole of the magnet and configured to direct the magnetic field toward the at least one feature;
at least one coil mounted in the magnetic field and being stationary relative to the magnet, the at least one coil configured to generate a sensor signal indicative of a variation in the magnetic field caused by movement of the at least one feature in the magnetic field; and
a magnetic shield configured to define a magnetic return path for some of a magnetic flux of the magnetic field exiting from the first pole of the magnet toward the second pole, the magnetic shield comprising at least one wall member spanning a distance of relative displacement between the at least one feature and the sensor.

13. The sensor of claim 12, wherein the at least one feature comprises at least one position marker provided on a feedback device coupled to rotate with a variable-pitch aircraft propeller rotor about an axis and to be displaced axially along the axis with adjustment of a blade angle of rotor blades of the rotor, the sensor mounted adjacent the feedback device and configured to detect a passage of the at least one position marker as the feedback device rotates about the axis.

14. The sensor of claim 13, wherein the at least one wall member of the magnetic shield comprises a top wall, at least one side wall, and a bottom wall cooperatively defining a receptacle within which part of the at least one coil and part of the pole piece are received, the bottom wall positioned adjacent the at least one position marker and comprising an aperture for permitting passage of the magnetic field therethrough, the bottom wall further comprising at least one extension member that extends laterally away from a housing of the sensor and spans a distance over which the at least one feature is displaced with axial displacement of the feedback device along the axis.

15. The sensor of claim 14, wherein the at least one position marker extends axially from a first end to a second end, and further wherein the at least one extension member extends away from the housing and beyond at least one of the first end and the second end, with an edge of the at least one extension member being spaced from the at least one of the first end and the second end by a predetermined distance.

16. The sensor of claim 14, wherein the at least one position marker extends axially from a first end to a second end, and further wherein the at least one extension member away from the housing, with an edge of the at least one extension member preceding the at least one of the first end and the second end by a predetermined distance.

17. The sensor of claim 14, wherein the at least one position marker extends axially from a first end to a second end, and further wherein the at least one extension member extends away from the housing, with an edge of the at least one extension member being aligned with the at least one of the first end and the second end.

18. The sensor of claim 14, wherein the at least one extension member has a curvilinear shape.

19. The sensor of claim 14, wherein the at least one extension member extends along one of a direction substantially parallel to the axis and a direction substantially transverse to the axis.

20. The sensor of claim 14, wherein the at least one position marker comprises a first plurality of position markers circumferentially spaced from one another and at least one second position marker positioned between two adjacent ones of the first plurality of position markers, the first plurality of position markers oriented substantially parallel to the axis and the at least one second position marker oriented along a first direction at an angle relative to the axis, and further wherein the at least one extension member extends along a second direction substantially parallel to the first direction.

* * * * *